United States Patent
Matsushita et al.

(10) Patent No.: US 9,754,815 B2
(45) Date of Patent: Sep. 5, 2017

(54) COMPOSITE SUBSTRATE AND METHOD FOR PRODUCING SAME

(71) Applicant: KYOCERA Corporation, Kyoto-shi, Kyoto (JP)

(72) Inventors: Hideki Matsushita, Yasu (JP); Masanobu Kitada, Kyoto (JP)

(73) Assignee: KYOCERA CORPORATION, Kyoto-Shi, Kyoto (JP)

(*) Notice: Subject to any disclaimer, the term of this patent is extended or adjusted under 35 U.S.C. 154(b) by 32 days.

(21) Appl. No.: 15/025,830

(22) PCT Filed: Sep. 29, 2014

(86) PCT No.: PCT/JP2014/075802
§ 371 (c)(1),
(2) Date: Mar. 29, 2016

(87) PCT Pub. No.: WO2015/046483
PCT Pub. Date: Apr. 2, 2015

(65) Prior Publication Data
US 2016/0247712 A1  Aug. 25, 2016

(30) Foreign Application Priority Data

Sep. 30, 2013 (JP) .................. 2013-203049
Mar. 26, 2014 (JP) .................. 2014-063553

(51) Int. Cl.
*H01L 21/762* (2006.01)
*H01L 29/06* (2006.01)
*B23K 20/00* (2006.01)
*H01L 21/20* (2006.01)

(52) U.S. Cl.
CPC ........ *H01L 21/76251* (2013.01); *B23K 20/00* (2013.01); *H01L 21/2007* (2013.01); *H01L 29/0649* (2013.01)

(58) Field of Classification Search
CPC ..................................... H01L 21/2007
See application file for complete search history.

(56) References Cited

FOREIGN PATENT DOCUMENTS

| JP | 2791429 B | 6/1998 |
|----|-----------|--------|
| JP | 2007-324195 A | 12/2007 |
| JP | 4162094 B | 8/2008 |
| WO | 2012/105473 A1 | 8/2012 |

OTHER PUBLICATIONS

International Search Report (Form PCT/ISA/210) mailed on Dec. 16, 2014, issued for PCT/JP2014/075802.

*Primary Examiner* — Ian Rummel
(74) *Attorney, Agent, or Firm* — Volpe and Koenig, P.C.

(57) ABSTRACT

A composite substrate 1 according to the present invention comprises: a supporting substrate 10 that is formed of an insulating material; a semiconductor part 20 that is disposed over the supporting substrate 10; and interfacial inclusions 30 that are present at the interface between the supporting substrate 10 and the semiconductor part 20 and contains Ni and Fe so that the ratio of Ni to Fe is 0.4 or more. Consequently, the present invention is able to provide a highly reliable composite substrate wherein the interfacial inclusions 30 are prevented from diffusing into the semiconductor part 20.

7 Claims, 12 Drawing Sheets

COMPOSITE SUBSTRATE AND METHOD FOR PRODUCING SAME

TECHNICAL FIELD

The present invention relates to a composite substrate including a semiconductor portion and a method for producing the composite substrate.

BACKGROUND ART

In recent years, techniques for reducing parasitic capacitance have been under development in order to improve the performance of semiconductor devices. The techniques for reducing parasitic capacitance include a silicon-on-sapphire (SOS) structure.

There is a method for producing the SOS structure by bonding substrates composed of different materials together. An example of the method for bonding substrates composed of different materials is a normal-temperature bonding method. The basic technical content of the normal-temperature bonding method is described in, for example, Japanese Patent No. 2791429. In Japanese Patent No. 2791429, surfaces of two substrates are activated and brought into contact with each other to bond the substrates composed of different materials.

SUMMARY OF INVENTION

Technical Problem

However, in the case where the normal-temperature bonding method is employed for the formation of the SOS structure, contamination with a metal, such as Fe, may occur between substrates when the substrates are bonded together. The metal may diffuse into silicon to be formed into a functional layer of a semiconductor device to adversely affect the operation of the semiconductor device. The reason for this is described below without being limited to the normal-temperature bonding method. A housing configured to maintain an environment for bonding and internal members therein are typically composed of a metal, such as stainless steel (SUS). Thus, contamination with a component (mainly Fe) originating from stainless steel (SUS) occurs simultaneously when surfaces to be bonded together are activated. An example of the housing is a chamber of a vacuum apparatus.

To bond substrates composed of different materials together, a technique for intentionally providing a metal at a bonding interface is also known (for example, see Japanese Patent No. 4162094).

The present invention has been devised in light of the foregoing circumstances. It is an object of the present invention to provide a composite substrate in which the diffusion of a metal into a semiconductor portion is suppressed and a method for manufacturing the composite substrate.

Solution to Problem

A composite substrate according to an embodiment of the present invention includes a supporting substrate having an insulating material, a semiconductor portion provided over the supporting substrate, and interfacial inclusions present at the interface between the supporting substrate and the semiconductor portion, the interfacial inclusions containing Ni and Fe, and the ratio of Ni to Fe being 0.4 or more.

A method for producing a composite substrate according to an embodiment of the present invention includes a preparation step, an activation step, a metal supply step, a bonding step, and a thickness reduction step. In the preparation step, a supporting substrate composed of an insulating material and a single-crystal semiconductor substrate are prepared. In the activation step, a main surface of the supporting substrate and a main surface of the semiconductor substrate are individually subjected to irradiation using a FAB gun to activate both of the main surfaces. The semiconductor substrate is activated in a state in which the semiconductor substrate and the supporting substrate do not face each other. In the metal supply step, a metal containing Ni and Fe is supplied to at least one of the activated main surface of the supporting substrate and the activated main surface of the semiconductor substrate, the metal being composed of a metal element other than main components contained in the supporting substrate and the semiconductor substrate. In the bonding step, the activated main surface of the semiconductor substrate and the activated main surface of the supporting substrate are brought into contact with each other at normal temperature to bond the semiconductor substrate and the supporting substrate together. In the thickness reduction step, the thickness of the semiconductor substrate is reduced from the other main surface of the semiconductor substrate to form the semiconductor substrate into a semiconductor portion.

Advantageous Effects of Invention

According to the present invention, a composite substrate in which the diffusion of a metal present at the bonding interface into a semiconductor portion is suppressed and a method for producing the composite substrate is provided.

DESCRIPTION OF EMBODIMENTS (Composite Substrate)

A composite substrate according to an embodiment of the present invention will be described below with reference to the drawings.

Figure 1A:
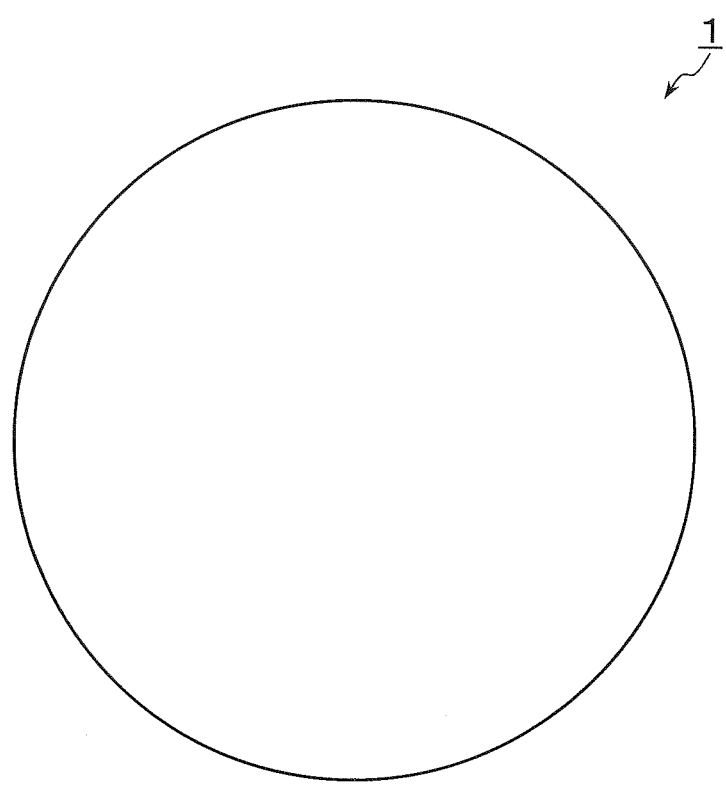
FIG. 1(a) is a plan view of a schematic structure of a composite substrate according to an embodiment of the present invention.
Figure 1B:
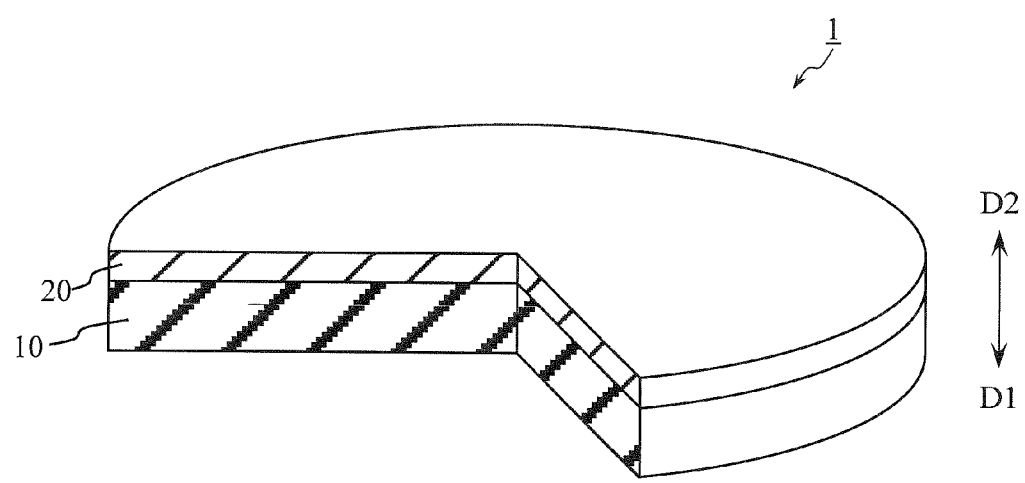
FIG. 1(b) is a fragmentary perspective sectional view of the composite substrate.
Figure 1C:
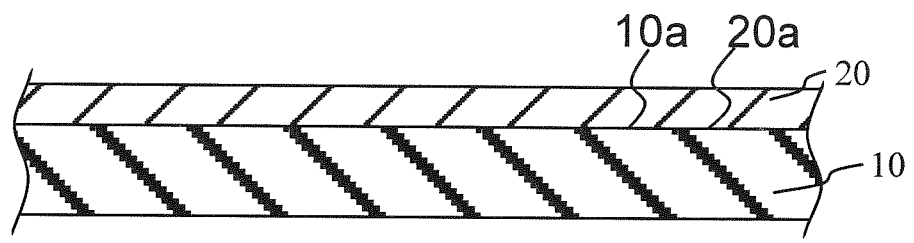
FIG. 1(c) is a cross-sectional view of the composite substrate.

FIG. 1(a) is a plan view illustrating a schematic structure of a composite substrate 1 according to an embodiment of the present invention. FIG. 1(b) is a fragmentary sectional view of the composite substrate 1. FIG. 1(c) is a cross-sectional view of the composite substrate 1.

The composite substrate 1 includes a supporting substrate 10 and a semiconductor portion 20. The supporting substrate 10 is composed of a single crystal of an insulating material.

Examples of a material that may be used for the formation of the supporting substrate 10 include a piezoelectric substrate mainly composed of lithium tantalate, single-crystal aluminum oxide (sapphire), and silicon carbide. In this embodiment, descriptions are made by taking the R-plane of a sapphire substrate with a diameter of 6 inches as an example.

The semiconductor portion 20 is a single-crystal layer composed of a semiconductor material. Examples of a semiconductor material that may be used for the formation of xthis embodiment, descriptions are made by taking a semiconductor material composed of Si as an example. The whole of a main surface of the semiconductor portion 20 is bonded to the supporting substrate 10.

Here, interfacial inclusions 30 are present at the interface between the supporting substrate 10 and the semiconductor portion 20. The interfacial inclusions 30 contain Fe and Ni, the composition thereof being controlled in such a manner that the ratio of Ni to Fe is 0.4 or more. This indicates that in the case where both of Fe and Ni are contained, the proportion of Ni is significantly high, compared with a typical stoichiometry of stainless steel (SUS). The interfacial inclusions 30 are present in a very small region. Thus, the illustration thereof in the drawings is omitted.

Here, the "interface" between the supporting substrate 10 and the semiconductor portion 20 is used to indicate a 5-nm-thick region extending from a bonding portion where the supporting substrate 10 and the semiconductor portion 20 are in contact with each other toward the semiconductor portion 20. The ratio of the amount of Fe and the amount of Ni present in the interface per unit area may be determined in terms of the number of the atoms present there.

In addition to Fe and Ni, the interfacial inclusions 30 may further contain a metal atom of a metal element, for example, Cr, Cu, C, or Ar, other than main components (Al and Si) contained in the supporting substrate 10 and the semiconductor portion 20.

The number of atoms of each atom per unit area at the interface may be measured by, for example, inductively coupled plasma mass spectrometry (ICP-MS) or secondary ion mass spectrometry (SIMS). Specifically, a certain volume of part of the semiconductor portion 20 on the supporting substrate 10 is dissolved in an etching solution. The number of atoms of each metal is measured by ICP-MS. All of the atoms are supposed to be present in an interfacial region extending from the interface to a position 5 nm or less from the interface. The density may be determined in the plane direction. This supposition is based on the fact that we have observed and measured distribution states of the atoms of the metals in the thickness direction in a plurality of composite substrates according to this embodiment and have found that even in the case where the largest amounts of metals are observed, the metals are present in a region (interface) of the semiconductor portion 20 adjacent to the supporting substrate 10, the region extending from the interface to a position 5 nm or less from the interface, and negligibly diffuse in the other region. The amount of each of the elements present may have a distribution in the depth direction. The measurement may be performed by in-depth analysis using SIMS, instead of ICP-MS.

In the composite substrate 1 having a controlled metal component ratio as described above, the diffusion of the metals into the semiconductor portion 20 and the aggregation of the metals at the interface are inhibited. These characteristics will be described in detail below.

The metal atoms at the bonding interface act as adhesives when two components composed of different materials are bonded together, and thus are seemingly required to achieve bonding. However, in the case where irradiation is performed with an ion gun or a FAB gun to activate surfaces of the supporting substrate 10 and the semiconductor portion 20 for bonding, the metal atoms can adhere by the vacuum process or the like. Such metal atoms can diffuse or migrate from the bonding surfaces to the semiconductor portion 20 where a semiconductor device is produced. In this case, the performance of the semiconductor device is affected to reduce the reliability.

The inventors have performed many experiments and have found that in the case where Fe is contained as a metal atom, Fe aggregates after bonding or diffuses into the semiconductor portion 20. The inventors also have found that Ni is less likely to aggregate after bonding or diffuse into the semiconductor portion 20. In other words, in the semiconductor portion 20, Fe is highly electrically active, and Ni is less electrically active.

Here, it is speculated that the metal atoms often originate from stainless steel (SUS), which is typically used for an apparatus for handling the supporting substrate 10 and semiconductor portion 20, an apparatus for bonding them together, and so forth. In this case, the ratio of Fe is high, and the ratio of the Fe to Ni is about 10:1. That is, the ratio of Ni to Fe is about 0.1. As described above, it was found that when the ratio of Fe is increased, the metal atoms are more liable to aggregate to cause segregation in the interfacial region.

It was also found that an increase in the proportion of Ni in the metal atoms maintains the bonding strength while the aggregation and the segregation in the interfacial region and the diffusion into the semiconductor portion 20 are inhibited.

The amount of Ni present only needs to be less than its solid solubility in the semiconductor portion 20 because in the case where the amount of Ni present is more than its solid solubility in the semiconductor portion 20, an intermetallic compound with a material contained in the semiconductor portion 20 is formed to increase the electrical activity. In this example, in order not to form a silicide, the amount of Ni present is less than $10^{15}$ atoms/cm$^2$, which is the density of Si present.

(First Method for Producing Composite Substrate)

A method for producing a composite substrate according to an embodiment of the present invention will be described with reference to the drawings.

(Preparation Step)

Figure 2:
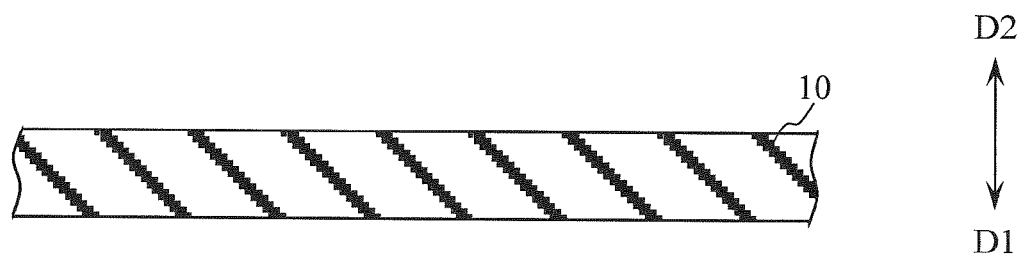
FIGS. 2(a) to 2(c) are cross-sectional views illustrating production steps of a method for producing a composite substrate according to an embodiment of the present invention.
Figure 2:
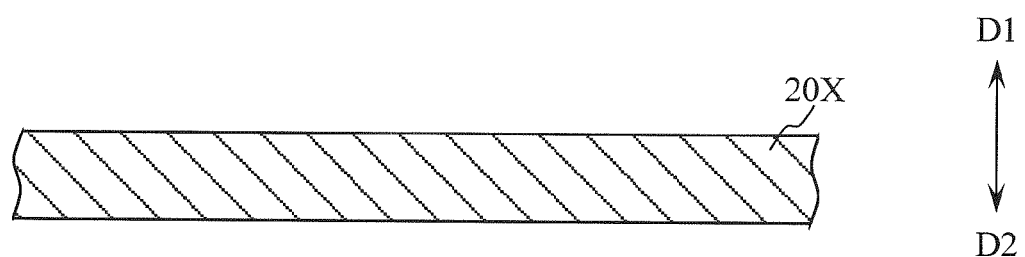
Figure 2:
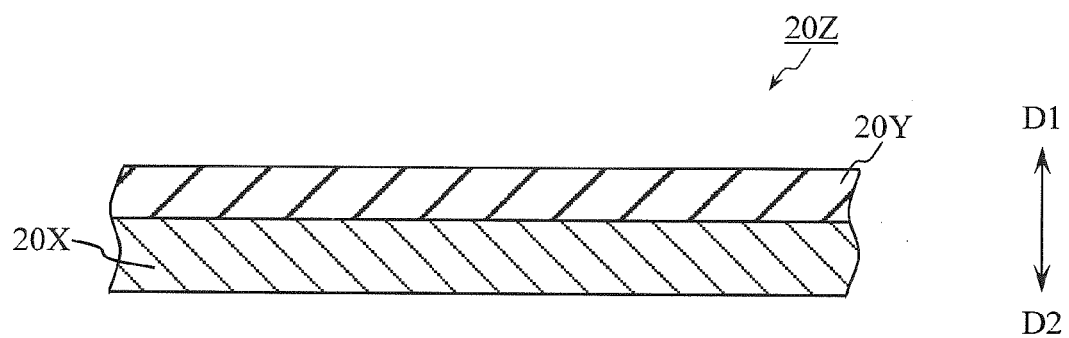

As illustrated in FIG. 2(a), the supporting substrate 10 is prepared. The supporting substrate 10 is not particularly limited as long as it is composed of a single crystal of an insulating material. An example thereof is a sapphire substrate. As illustrated in FIG. 2(b), a single-crystal semiconductor base substrate 20X is prepared. In this example, the semiconductor base substrate 20X composed of silicon (Si) is prepared. The semiconductor base substrate 20X has a relatively high dopant concentration. For example, boron, which serves as a p-type dopant, is contained in a concentration of $1\times10^{18}$ atoms/cm$^3$ or more and $1\times10^{21}$ atoms/cm$^3$ or less.

Next, silicon is epitaxially grown on an upper surface of the semiconductor base substrate 20X in the direction indicated by arrow D1 to form a semiconductor layer 20Y as illustrated in FIG. 2(c). Examples of a method of epitaxial growth that may be employed include various methods, such as a thermochemical vapor deposition method (thermal CVD method) in which growth is performed by allowing a gaseous silicon compound to pass by a surface of the semiconductor base substrate 20X to thermally decompose with the semiconductor base substrate 20X heated. The semiconductor layer 20Y is epitaxially grown on the silicon substrate; hence, the number of lattice defects can be reduced, compared with the case of epitaxial growth on a sapphire substrate.

As the semiconductor layer 20Y, a semiconductor layer having a lower dopant concentration than that of the semiconductor base substrate 20X may be used. The semiconductor layer 20Y is formed in such a manner that the dopant concentration decreases gradually from the semiconductor base substrate 20X side toward an upper surface. An upper surface portion of the semiconductor layer 20Y is formed so as to have a relatively low dopant concentration (for example, less than $1 \times 10^{16}$ atoms/cm$^3$). Here, "undoped silicon" simply indicates silicon that is not doped with an impurity in a purposeful manner and is not limited to intrinsic silicon that does not contain an impurity. The semiconductor layer 20Y according to this embodiment is composed of p-type silicon and formed in such a manner that the upper surface portion has a low dopant concentration. The dopant concentration of the semiconductor layer 20Y may be controlled by adjusting the amount of an impurity supplied during epitaxial growth. In the case where the amount of the impurity supplied is set to zero, undoped silicon may be formed. The dopant concentration may be gradually changed by the diffusion and reduction of a dopant during epitaxial growth.

In this way, a semiconductor substrate 20Z in which the semiconductor layer 20Y is disposed on the semiconductor base substrate 20X is prepared.

(Activation Step)

Figure 3:
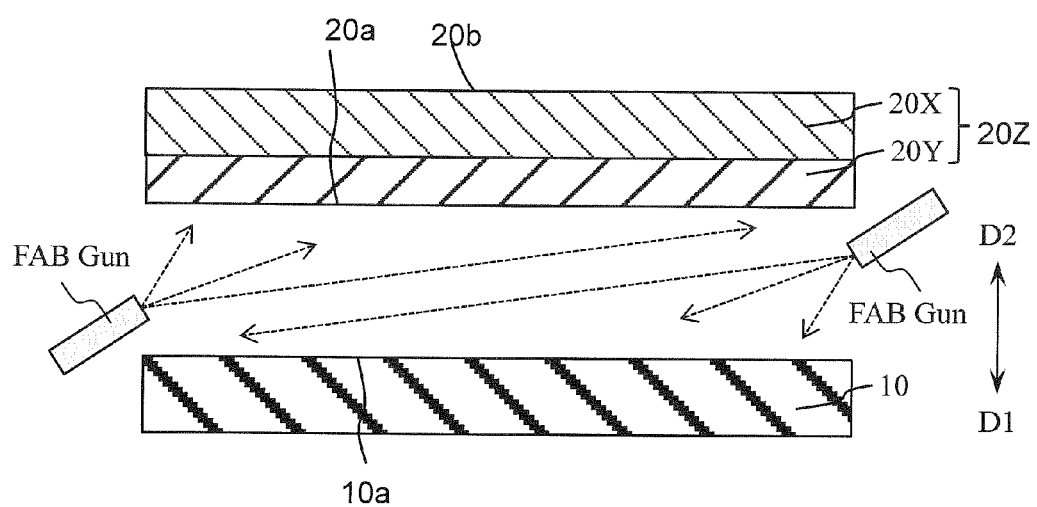
FIGS. 3(a) to 3(d) are cross-sectional views illustrating production steps following that illustrated in FIG. 2(c) of the method for producing a composite substrate according to an embodiment of the present invention.
Figure 3:
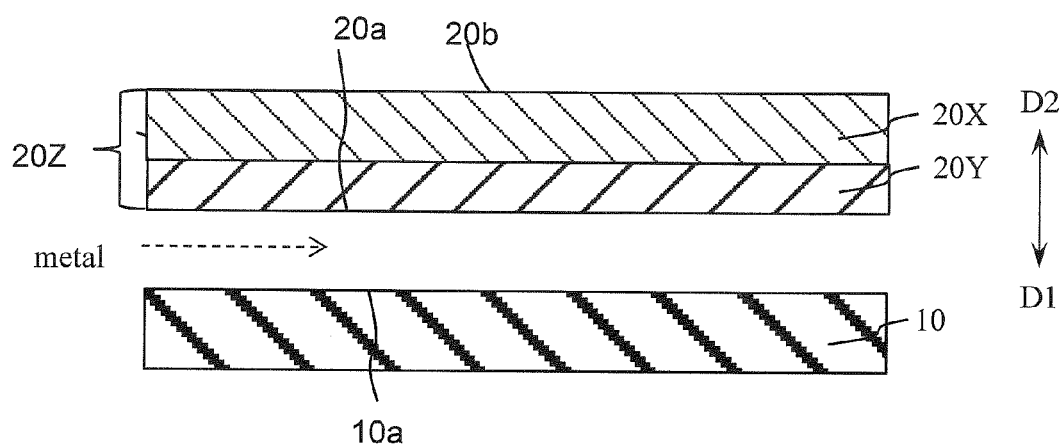
Figure 3:
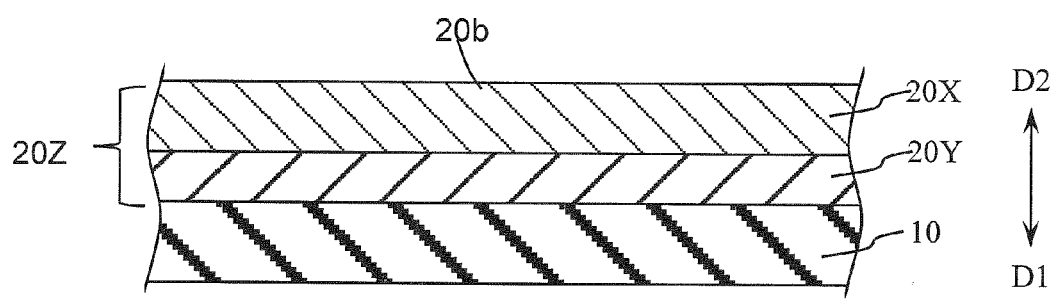
Figure 3:
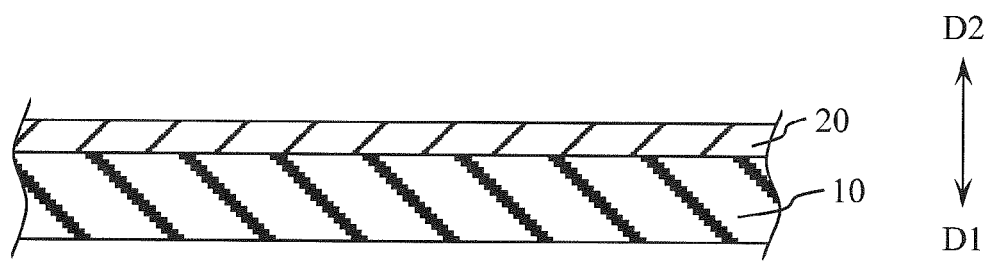

As illustrated in FIG. 3(a), a main surface 10a of the supporting substrate 10 and a main surface 20a of the semiconductor substrate 20Z (a surface of the semiconductor layer 20Y) are irradiated with a beam from a fast atom beam (FAB) gun to activate both main surfaces 10a and 20a. As the FAB gun, for example, a FAB gun that emits a neutral atom beam of Ar is used. By activating both main surfaces 10a and 20a, dangling bonds are formed on both main surfaces 10a and 20a.

(Metal Supply Step)

As illustrated in FIG. 3(b), a metal contained in the interfacial inclusions 30 is supplied to at least one of the activated main surface 10a of the supporting substrate 10 and the activated main surface 20a of the semiconductor substrate. Here, the metal contains Ni and Fe and does not contain an element serving as a main component of the supporting substrate 10 or an element serving as a main component of the semiconductor substrate 20Z. Specifically, in this example, Al and Si are excluded. For example, Fe, Ni, Cr, Ni, Cu, and so forth may be exemplified. The ratio of Ni to Fe present is 0.3 or more. In this example, the ratio is set to 0.4 or more. The metal supply step may be performed simultaneously with or subsequent to the activation step.

The metal may be supplied by, in advance, incorporating a desired amount thereof into an atmosphere in which the activation has been performed. A desired amount of the metal may be supplied by arranging a metal supply component (for example, a metal plate containing Fe and Ni) in an atmosphere in which the activation has been performed and then etching (sputtering) the metal supply component. For example, a vacuum chamber and a stage configured to hold the supporting substrate 10 and the semiconductor substrate 20Z may be substituted for the metal supply component. For the etching, a FAB gun the same as that used in the activation step may be used. The metal supply step may be performed simultaneously with or subsequent to the activation step.

The ratio of Ni to Fe present may be controlled by adjusting the amounts of atoms supplied. For example, the amounts supplied may be adjusted in such a manner that a metal supply component composed of Ni is sputtered more than a metal supply component composed of Fe is sputtered.

Figure 4:
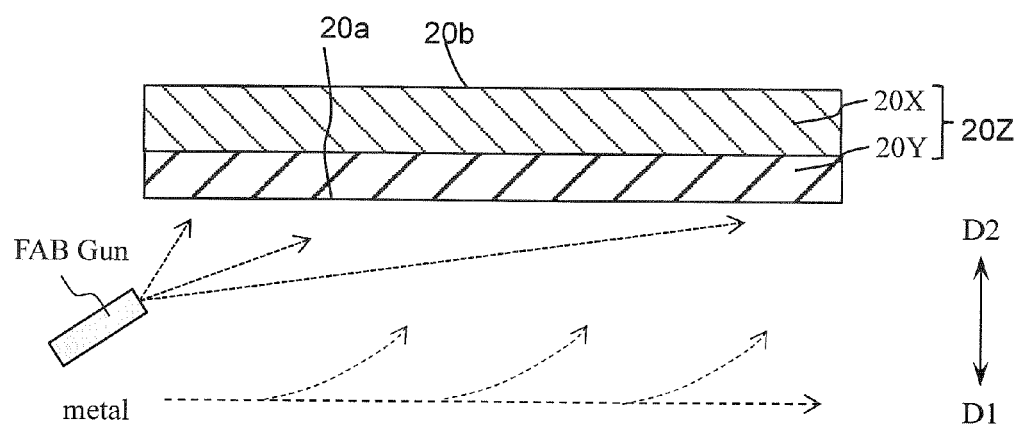
FIGS. 4(a) and 4(b) are cross-sectional views illustrating an activation step.
Figure 4:
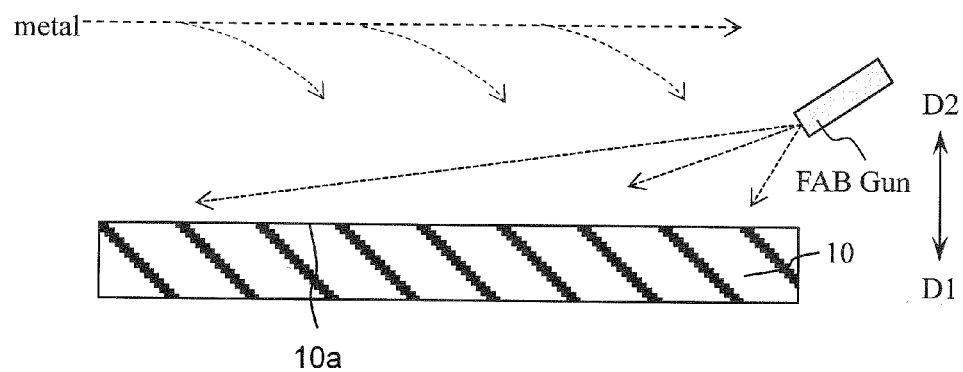

As illustrated in FIGS. 4(a) and 4(b), it may also be produced by simultaneously performing the activation step and the metal supply step, and activating at least the semiconductor substrate 20Z or separately activating the supporting substrate 10 and the semiconductor substrate 20Z in a state (non-facing state) in which the supporting substrate 10 and the semiconductor substrate 20Z do not face each other in a chamber of a vacuum apparatus. The term "non-facing state" used here indicates a physically non-facing state or a temporally non-facing state and indicates a state in which both main surfaces 10a and 20a of the supporting substrate 10 and the semiconductor substrate 20Z do not face each other in a state of being simultaneously subjected to irradiation using the FAB gun and being simultaneously activated. FIG. 4 illustrates the case where the activation of the supporting substrate 10 is also performed in the non-facing state.

Although the reason for this is unclear, the inventors have conducted experiments and have demonstrated that even in the case where a metal supply component in which the ratio of Fe is higher than that of Ni is subjected to sputtering to supply the metals, the separate irradiation and activation using the FAB gun in the non-facing state results in an extremely high proportion of Ni.

An example in which a metal supply component composed of stainless steel (SUS) is used will be described as a specific example. In the composition of stainless steel (SUS), the ratio of Ni to Fe present is about 0.1. In addition, the sputtering yields of Ni and Fe are not much different from each other. Thus, typically, when stainless steel (SUS) is subjected to sputtering, metal atoms corresponding to the composition of the stainless steel (SUS) are supplied to the activated surface. In fact, in the case where the supporting substrate 10 and the semiconductor substrate 20Z are arranged so as to face each other and are simultaneously activated, peripheral stages serving as metal supply components are subjected to sputtering to supply Ni and Fe to a bonding interface. In this case, analysis of the amounts of the metal atoms on both activated surfaces of the supporting substrate 10 and the semiconductor substrate 20Z demonstrated that both Ni and Fe were present in amounts corresponding to the composition of the stainless steel (SUS).

In contrast, in the case where the supporting substrate 10 and the semiconductor substrate 20Z in the non-facing state were separately activated by irradiation using the FAB gun, analysis of the amounts of metal atoms on the activated surfaces demonstrated that the amount of Ni contained was larger than that of Fe. Specifically, the results demonstrated that the ratio of Ni to Fe was 1 or more. As described above, the ratio of Ni to Fe may also be controlled by the method of irradiation using the FAB gun.

In particular, the necessity of activating the semiconductor substrate 20Z in the non-facing state will be described here.

In the case where irradiation is performed with the FAB gun, the semiconductor substrate 20Z and the supporting substrate 10 that has a stable surface state at room temperature are activated to different degrees. In the activated state, the amounts of metals supplied seemingly affects the amounts of metals of the interfacial inclusions 30 and the metal composition of the interfacial inclusions 30. Thus, for the semiconductor substrate 20Z to be activated to a higher degree than that of the supporting substrate 10, the non-facing state needs to be ensured as described above.

In the example illustrated in FIG. 4, after the main surface 20a of the semiconductor substrate 20Z is irradiated using the FAB gun as illustrated in FIG. 4(a), the main surface 10a of the supporting substrate 10 is irradiated using the FAB gun as illustrated in FIG. 4(b). In this way, two activation operations are temporally separated to create the "non-facing state". When one is activated, the other may be physically isolated in a waiting room of the vacuum apparatus. In addition, both may be isolated from each other by sequential charging into the vacuum apparatus.

However, this example is not restrictive. For example, the supporting substrate 10 and the semiconductor substrate 20 may be arranged so as to be opposed to each other with a shield interposed therebetween in one vacuum apparatus, and may be simultaneously irradiated using the FAB gun. In this case, the use of the shield physically creates the "non-facing state". As the shield, for example, a ceramic material with high stability against the FAB gun may be used.

(Bonding Step)

As illustrated in FIG. 3(c), the main surface 10a of the supporting substrate 10 and the main surface 20a of the semiconductor substrate 20Z, which have been activated and to which the metals have been supplied, are brought into contact with each other at normal temperature to bond them. The term "normal temperature" is intended to mean room temperature, indicates that active heating is not performed, and permits an increase in temperature due to the activation and bonding processes. Specifically, a temperature of 10° C. or higher and 150° C. or lower is included.

In this bonding step, the interfacial inclusions 30 each containing Ni and Fe in predetermined amounts and in a predetermined ratio are present between the main surface 10a of the supporting substrate 10 and the main surface 20a of the semiconductor substrate 20Z.

(Thickness Reduction Step)

The thickness of the semiconductor substrate 20Z is reduced from the side of the other main surface 20b of the semiconductor substrate 20Z illustrated in FIG. 3(c) (in the D2 direction in the figure). Thereby, the semiconductor substrate 20Z is formed into the semiconductor portion 20.

Specifically, the thickness of the semiconductor base substrate 20X is reduced. As a processing method for reducing the thickness, various methods, such as abrasive grain polishing, chemical etching, and ion beam etching, may be employed. A plurality of methods may be employed in combination.

The thinned semiconductor base substrate 20X is further etched with an etching solution to reduce the thickness of the semiconductor layer 20Y together with the thinned semiconductor base substrate 20X. This etching can be performed by using a selective etching solution in which different dopant concentrations result in significantly different etching rates. Examples of the selective etching solution include a mixed solution of hydrofluoric acid, nitric acid, and acetic acid; and a mixed solution of hydrofluoric acid, nitric acid, and water. In this embodiment, a mixed solution of hydrofluoric acid, nitric acid, and acetic acid is used as the etching solution. In this embodiment in which p-type silicon is used, the etching solution is prepared in such a manner that etching proceeds at a high dopant concentration and that the etching rate is significantly decreased at a low dopant concentration of $7 \times 10^{17}$ atoms/cm$^3$ or less to $2 \times 10^{18}$ atoms/cm$^3$ or less. Examples of another method for performing selective etching include an electrolytic etching method performed in a solution of about 5% hydrogen fluoride; and a pulse electrode anodic oxidation method performed in a KOH solution. The semiconductor layer 20Y is etched to a position of a transition region in which the dopant concentration is gradually changed. Here, the semiconductor layer having a thickness reduced by the etching is referred to as the semiconductor portion 20. The semiconductor portion 20 has a thickness of, for example, about several hundred nanometers to about two micrometers.

Through the steps described above, the composite substrate 1 illustrated in FIG. 1 may be produced.

(Modified Embodiment: Amount of Interfacial Inclusion)

In the foregoing composite substrate 1, the amount of metal atoms constituting the interfacial inclusions 30 may be $1 \times 10^{12}$ atoms/cm$^2$ or less. In the case where the amount of the interfacial inclusions 30 is adjusted as described above and where the supporting substrate 10 and the semiconductor portion 20 are directly bonded together by activation at room temperature, a metal does not segregate at the interfacial region even if the supporting substrate 10 and the semiconductor portion 20 are heated after the bonding. The mechanism is not clear but seemingly associated with the amount of metal atoms constituting the interfacial inclusions 30 and the presence of uncombined dangling bonds left at the bonding interface after the bonding.

In the case where the ratio of Ni to Fe present is controlled and where the amount of the metal atoms as described above is obtained, the segregation is suppressed at the interfacial region, and the diffusion of the metal atoms into the semiconductor portion 20 is also suppressed.

Thereby, it is possible to provide the composite substrate 1 in which the influence of the metal atoms on the semiconductor portion 20 is suppressed.

As described above, in order that the amount of the interfacial inclusions 30 may be $1 \times 10^{12}$ atoms/cm$^2$ or less, the supporting substrate 10 and the semiconductor portion 20 are separately subjected to irradiation for bonding using the FAB gun while being in the non-facing state. In the case where surfaces of the supporting substrate 10 and the semiconductor portion 20 to be activated are arranged so as to face each other and irradiation is performed using the FAB gun, when one of the substrates is subjected to the irradiation using the FAB gun, a component around the one of the substrates can be simultaneously etched, so that suspended matter produced by the etching can adhere to the other. In contrast, irradiation using the FAB gun in the non-facing state inhibits suspended matter produced by etching during the activation of one of the surfaces from adhering to the other activated surface. This reduces the amount of the metal atoms to be formed into the interfacial inclusions 30.

A reduction in the distance between the FAB gun and the supporting substrate 10 and between the FAB gun and the semiconductor portion 20 and setting an irradiation angle of about 90° with respect to the supporting substrate 10 and the semiconductor portion 20 are effective in inhibiting a component other than the supporting substrate 10 or the semiconductor portion 20 from being subjected to unintentional irradiation using the FAB gun.

In the case where the amount of the interfacial inclusions 30 is $1 \times 10^{10}$ atoms/cm$^2$ or more, remaining dangling bonds due to a mismatch in lattice constant between the supporting substrate 10 and the semiconductor portion 20 are stabilized by the interfacial inclusions 30 in the bonding step.

(Modified Embodiment 2: Ratio of Ni to Fe Present and Amount Thereof Present)

In the foregoing composite substrate 1, in the case of a small amount of the interfacial inclusions 30 present or a small amount of Fe, the ratio of Ni to Fe may be increased. In this case, a reduction in the amount of Fe suppresses metal diffusion, and an increase in the ratio of Ni maintains the bonding. For example, in the case where the amount of Fe is of the order of $10^{10}$ atoms/cm$^2$, the ratio of Ni to Fe is 5 or more. In the case where the amount of Fe is the first half of the order of $10^{11}$ atoms/cm$^2$, the ratio of Ni to Fe is 0.5 to 2 or more. In these cases, it has been confirmed that the diffusion of the metals is inhibited and that the bonding is maintained.

(Modified Embodiment 3: Others)

In the foregoing composite substrate 1, Ar may be contained as the interfacial inclusions 30. In this case, Ar can serve as a getter for Fe and inhibit the diffusion of Fe into the semiconductor portion 20. The amount of Ar present per unit area is larger than the amount of Fe present and smaller than the amount of atoms constituting the semiconductor portion 20. In this embodiment, the number of atoms of an element constituting the semiconductor portion 20 per unit area is determined from the amount of atoms constituting a single atomic layer of Si and found to be $1.35 \times 10^{15}$ atoms/cm$^2$. If the semiconductor portion 20 is composed of a compound semiconductor, the sum total of the numbers of atoms of elements constituting the compound per unit is used.

The upper limit of the amount of Ar is $1.35 \times 10^{15}$ atoms/cm$^2$ and preferably $1 \times 10^{14}$ atoms/cm$^2$ or less. In this case, it is possible to satisfactorily inhibit the occurrence of lattice defects and so forth in the semiconductor portion 20. More preferably, the upper limit is $5 \times 10^{13}$ atoms/cm$^2$ or less. At an excess of Ar with respect to the amounts of the metals, Ar can serve as a nucleus to form an amorphous portion. This configuration enables gettering of Fe and the maintenance of the crystallinity of the semiconductor portion 20.

(Second Method for Producing Composite Substrate)

In the first production method described above, in the case where the main surface 10a of the supporting substrate 10 and the main surface 20a of the semiconductor substrate 20Z (surface of the semiconductor layer 20Y) are subjected to irradiation using the FAB gun to activate both main surfaces 10a and 20a, irradiation energy from the FAB gun is not particularly described. Different irradiation energy levels may be used.

The inventors have repeatedly conducted experiments and have found that there is a difference in the level of activity required for bonding between the supporting substrate 10 and the semiconductor substrate 20Z. Although the reason for this is unclear, a mechanism as described below is assumed. When the semiconductor substrates 20Z are bonded together, the bonding is easily performed. However, it is difficult to bond the semiconductor substrate 20Z to a different material, such as sapphire. Thus, the bonding has been accomplished by incorporating a metal into the bonding interface. It is speculated from these phenomena that it is difficult to activate an article composed of a material having a stable surface state at normal temperature. Thus, in the case where the supporting substrate 10 is bonded to the semiconductor substrate 20Z, the bonding is more affected by the level of activity of the semiconductor substrate 20Z than by the level of activity of the supporting substrate 10.

The supporting substrate 10 is an insulating substrate and has a stable surface state at normal temperature. Thus, the level of activity of the semiconductor substrate 20Z to be bonded is important. That is, the level of activity of the semiconductor substrate 20Z is preferably higher than the level of activity of the supporting substrate 10. More specifically, the level of activity of the semiconductor substrate 20Z needs to be equal to or higher than the level of activity used in a typical normal-temperature boding method. Meanwhile, even if the level of activity of the supporting substrate 10 is significantly lower than the level of activity used in the typical normal-temperature boding method, the bonding is accomplished. These facts have been ascertained by repeating performing a bonding test after the activation of the supporting substrate 10 and the semiconductor substrate 20Z at different levels of activity. The "level of activity" may be estimated by the power of the FAB gun, the cumulative irradiation time, the distance between the FAB gun and a surface of an article to be irradiated, and so forth.

Based on the foregoing findings, in this embodiment, the activation step is divided into a first activation substep and a second activation substep. In the first activation substep, at least the main surface 20a of the semiconductor substrate 20Z is activated. In this case, the activation is performed by irradiation using the FAB gun in a state in which the main surface 20a of the semiconductor substrate 20Z does not face the main surface 10a of the supporting substrate 10.

Thus, even if the irradiation using the FAB gun is performed under typical intensity and time conditions required for bonding with a typical normal-temperature bonding apparatus, suspended matter produced by etching due to the irradiation using the FAB gun does not adhere to the main surface 10a of the supporting substrate 10.

Next, the second activation substep is performed. In the second activation substep, a surface (main surface 10a) of the supporting substrate 10 is activated by irradiation using the FAB gun under a condition in which cumulative irradiation energy is lower than that of the irradiation using the FAB gun in the first activation substep. Here, the energy which is emitted from the FAB gun and which actually reaches a surface to be activated differs from a value in the irradiation conditions using the FAB gun. However, the energy which actually reaches the surface to be activated depends on the product of the acceleration voltage of the FAB gun and the irradiation time. Thus, the product of the acceleration voltage and the irradiation time is hereinafter referred to as a "cumulative irradiation energy estimate" (also referred to simply as "cumulative irradiation energy"). Specifically, the value of cumulative irradiation energy in the second activation substep is a value between cumulative irradiation energy (second value) required to remove carbon and hydrogen adsorbed on a surface (main surface 10a) of the supporting substrate 10 and cumulative irradiation energy (first value) under typical activation conditions and is a value closer to the second value. More specifically, the value is comparable to or slightly higher than the second value. For example, in the case where the acceleration voltage of the FAB gun for the irradiation in the second activation substep is about ⅓ to about ⅔ of that in the first activation substep and where the irradiation time in the second activation substep is about 1/10 to about ⅓ of that in the first activation substep, high bonding strength is assuredly obtained.

Since the activation of the supporting substrate 10 is performed in the second activation substep, it is possible to adjust the irradiation conditions required for the bonding using the FAB gun. That is, they can be different from the conditions required for the activation of the semiconductor substrate 20Z. This inhibits the occurrence of the unwanted suspended matter due to the etching and reduces the amounts of metals present.

The first activation substep and the second activation substep may be simultaneously performed. The second activation substep may be performed after the first activation substep. In this embodiment, the first activation substep is performed, and then the second activation substep is performed.

As described above, in the case where the first activation substep and the second activation substep are temporally separated, even if suspended matter produced in the first activation substep reaches a surface (main surface 10a) of the supporting substrate 10, the suspended matter is less likely to be adsorbed because of an unactivated state. Even if the suspended matter is adsorbed, the adsorbed matter can be removed in the second activation substep. This inhibits the incorporation of unwanted inclusions into the interface.

The main surface 20a of the semiconductor substrate 20Z activated in the first activation substep is exposed in an activated state in a vacuum chamber. In this case, suspended matter in the vacuum chamber adheres (is adsorbed) easily on the activated main surface 20a of the semiconductor substrate 20Z. Thus, an additional irradiation step may be provided. That is, after irradiation using the FAB gun is performed again to remove the adsorbed matter on the surface, the step of bonding them may be performed. The cumulative irradiation energy from the FAB gun in the additional irradiation step may be substantially equal to that in the second activation substep. The additional irradiation step may be performed simultaneously with the second activation substep.

By performing the second activation substep and the additional irradiation step, it is possible to reduce the amounts of foreign matter and inclusions at the interface. Specifically, we have demonstrated that in the case where the main surface 20a of the semiconductor substrate 20Z is simultaneously subjected to irradiation using the FAB gun in the second activation substep, the number of adhering foreign matter having a size of 0.12 to 0.5 µm is 100 or less on the main surface 20a. Note that we have demonstrated that in the case where the supporting substrate 10 and the semiconductor substrate 20Z are activated at a typical irradiation energy level in the normal-temperature boding method and bonded together, 1000 pieces or more of foreign matter adhere thereto.

In the case where the main surface 20a of the semiconductor substrate 20Z is subjected to irradiation using the FAB gun in the additional irradiation step, the bonding strength is ensured. If the supporting substrate 10 alone is subjected to irradiation using the FAB gun in the second activation substep, sputtered atoms can be suspended in the vacuum chamber and can re-adhere to the activated surface of the semiconductor substrate 20Z to reduce the bonding strength. This is significant when it takes a long time from the activation to the bonding of the substrates together. Thus, in the case where two surfaces to be activated are activated in the non-facing state and where the non-facing state is accomplished by temporal separation, it is effective to subject the main surface 20a of the semiconductor substrate 20Z to re-irradiation using the FAB gun in the additional irradiation step. Regarding the irradiation conditions using the FAB gun, the second irradiation is performed at a low acceleration voltage or for a short time, compared with the first irradiation. This is because an increase in metal atoms by newly sputtering a metal-containing component during the second irradiation is inhibited. Even though the second irradiation using the FAB gun is performed at a low acceleration voltage, the re-activation of a surface that has been activated once is sufficient. That is, the level of activity may be increased in such a manner that dangling bonds are formed by breaking atomic bonds in the semiconductor substrate 20Z during the first irradiation using the FAB gun and that C, H, and so forth adhering to the dangling bonds are removed during the second irradiation.

In the case where the additional irradiation step is performed simultaneously with the second activation substep, irradiation using the FAB gun may be performed in a state in which the supporting substrate 10 and the semiconductor substrate 20Z face each other. Also in this case, the cumulative irradiation energy estimated from the product of the acceleration voltage of the FAB gun and the irradiation time during the second irradiation is lower than that during the first irradiation. This enables the bonding while only a small amount of metal atoms is present at the interface. For example, in the case where the acceleration voltage of the FAB gun during the second irradiation is about ⅓ to about ⅔ of that during the first irradiation and where the irradiation time during the second irradiation is about ⅒ to about ⅓ of that during the first irradiation, high bond strength is assuredly accomplished while the effect of reducing the amount of metal atoms is maintained. Furthermore, we have demonstrated that regarding the ratio of metals, a high proportion of Ni is maintained.

Naturally, the irradiation using the FAB gun in the second activation substep may be performed in the non-facing state. Also in this case, when the irradiation time using the FAB gun during the second irradiation is about ⅒ to about ⅓ of that during the first irradiation, activated surfaces can be bonded together immediately after activation.

(Modified Embodiment)

In the foregoing embodiment, the time from the activation of the main surface 10a of the supporting substrate 10 and the main surface 20a of the semiconductor substrate 20Z in the activation step to the bonding of the main surfaces 10a and 20a together in the bonding step is not particularly limited. The time from the activation to the bonding of the main surfaces 10a and 20a is preferably within 5 minutes because the bonding strength decreases with time.

When the supporting substrate 10 and the semiconductor substrate 20Z were bonded together immediately after the irradiation using the FAB gun, the bonding strength was 300 kg/cm². In contrast, it was found that when the bonding was performed after 5 minutes of the irradiation using the FAB gun, a low bonding strength of 10 to 50 kg/cm² was obtained.

In the foregoing embodiment, the irradiation time and the irradiation intensity from the FAB gun in the activation step are not particularly limited. The irradiation time may be reduced because an increase in irradiation time can increase the arithmetic mean roughness of the irradiated surfaces, causing difficulty in the bonding in the subsequent bonding step. Furthermore, suspended atoms of, for example, Fe and Ni suspended in the vacuum apparatus are in activated states and can adhere and penetrate into the inside. Thus, the irradiation time using the FAB gun is preferably within 5 minutes and more preferably within 1 minute.

Meanwhile, a reduction in irradiation time using the FAB gun can result in insufficient activation to cause difficulty in the bonding in the bonding step. For this reason, an increase in irradiation intensity from the FAB gun compensates for this. Specifically, in the case where neutrons of Ar are used for the FAB gun, the actual level of activity may be speculated on the basis of the amount of Ar present. We have demonstrated that even when the irradiation time is reduced, reliable bonding is accomplished at an amount of Ar of $5 \times 10^{12}$ atoms/cm$^2$ or more and preferably $1.5 \times 10^{13}$ atoms/cm$^2$ or more. To satisfactorily maintain the crystallinity of the semiconductor substrate 20Z, the amount of Ar is preferably $1 \times 10^{14}$ atoms/cm$^2$ or less. Thus, in the case where the activation is performed for an irradiation time of 5 minutes or less, the irradiation intensity may be set in such a manner that the amount of Ar on the activated surfaces is $5 \times 10^{12}$ atoms/cm$^2$ or more and $1 \times 10^{14}$ atoms/cm$^2$ or less. The amount of Ar may be measured by total reflection X-ray fluorescence (TXRF) spectrometry. In the case where the irradiation using the FAB gun for the semiconductor substrate 20Z is performed in the first activation substep and the additional irradiation step, in particular, the irradiation conditions using the FAB gun in the first activation substep may be set as described above.

EXAMPLES

Composite substrates according to Examples 1 to 4 were produced on the basis of the composite substrate 1 and the steps in the first production method. Composite substrates according to Comparative examples 1 and 2 were also produced, the composite substrates having different amounts of metals of the interfacial inclusions 30.

In each of the examples, a sapphire substrate was used as the supporting substrate 10, and the semiconductor portion 20a composed of single-crystal silicon was used. A normal-temperature bonding apparatus was used as a bonding apparatus. The activation of bonding surfaces was performed with a FAB gun. A vacuum chamber and stages configured to fix substrates and so forth of the normal-temperature bonding apparatus were composed of stainless steel (SUS) and also served as metal supply components. An activation step and a metal supply step were simultaneously performed.

Conditions in the activation step of activating the bonding surfaces of the supporting substrate 10 and the semiconductor portion 20 (semiconductor base substrate 20X) and the metal supply step were described below.

Example 1

Irradiation conditions using FAB gun: acceleration voltage: 1.0 kV, current: 100 mA, irradiation time: 5 minutes
Activation conditions: non-facing state (the non-facing state was accomplished temporally and physically by activating one of the substrates with the other substrate placed in another space. The same applies hereinafter).

Example 2

Irradiation conditions using FAB gun: acceleration voltage: 1.8 kV, current: 100 mA, irradiation time: 5 minutes
Activation conditions: non-facing state Example 3

After activation was performed under the same conditions as those in Example 2, additional irradiation was performed under conditions described below.
Irradiation conditions using FAB gun: acceleration voltage: 1.0 kV, current: 100 mA, irradiation time: 5 minutes
Activation conditions: facing state (the substrates were arranged so as to face each other and subjected to irradiation at the same time. The same applies hereinafter).

Example 4

After activation was performed under the same conditions as those in Example 2, additional irradiation was performed under conditions described below.
Irradiation conditions using FAB gun: acceleration voltage: 1.0 kV, current: 100 mA, irradiation time: 1 minute
Activation conditions: facing state Comparative Example 1

Irradiation conditions using FAB gun: acceleration voltage: 1.0 kV, current: 100 mA, irradiation time: 1 minute
Activation conditions: facing state Comparative Example 2

Irradiation conditions using FAB gun: acceleration voltage: 1.8 kV, current: 100 mA, irradiation time: 5 minutes
Activation conditions: facing state
After the activation step and the metal supply step were performed under the conditions, the amounts of metals of the bonding surfaces of the supporting substrate 10 and the semiconductor portion 20 before the bonding were measured by total reflection X-ray fluorescence (TXRF) spectrometry. As TXRF, TREX 630 manufactured by Technos was used.

The metal-atom densities (unit: $10^{12}$ atoms/cm$^2$) of Cr, Fe, and Ni contained in stainless steel (SUS) serving as a metal supply component and the composition (Cr:Fe:Ni) were described below. The metal-atom densities of Cr/Fe/Ni are described in that order.
Example 1: metal-atom density: 1.8/4.4/31, composition: 0.41:1:7.05
Example 2: metal-atom density: 1.2/4.4/30, composition: 0.27:1:6.82
Example 3: metal-atom density: 6.5/27/43, composition: 0.24:1:1.59
Example 4: metal-atom density: 24/110/63, composition: 0.22:1:0.57
Comparative example 1: metal-atom density: 44/190/34, composition: 0.23:1:0.18
Comparative example 2: metal-atom density: 37/160/45, composition: 0.23:1:0.28

The results demonstrated that even when the same metal supply component composed of stainless steel (SUS) was used, only the proportion of Ni was controlled by the use of different activation methods. It was found that the proportion of Cr was independent of the activation methods. Comparisons of Examples 1 and 2 with Examples 3 and 4 revealed that after the activation was performed once in the non-facing state, even though the irradiation using the FAB gun was performed in the facing state, a high proportion of Ni was maintained, compared with the composition of the stainless steel (SUS). Comparisons of Example 3 with Example 4 revealed that an increase in irradiation time using the FAB gun increased the amounts of metals contained in the interfacial inclusions 30.

Subsequently, the bonding strength of the composite substrates according to Examples 3 and 4 and Comparative examples 1 and 2 was measured. The bonding strength was measured with a thin-film adhesion strength measurement system, Romulus, manufactured by Quad Group Inc. with a stud pin having a diameter of 2.7 mm at a load of 0.5 kg/s. The results demonstrated that any of the composite substrates had a bonding strength of 856 to 965 kg/cm$^2$ and thus the bonding strength the same as in the past was achieved even at low proportions of Fe.

The composite substrates according to Examples 1 and 2 had lower bonding strength than those according to Examples 3 and 4. The reason for this is presumably that the non-facing state was accomplished by even temporal separation in the activation conditions. That is, the reason is presumably that the level of activity of the surface first activated was reduced at the time of bonding. In order to obtain the bonding strength equivalent to those in Examples 3 and 4 while the amounts of the metals and the metal ratios in Examples 1 and 2 are maintained, it is effective to accomplish the non-facing state by physical separation alone in the activation conditions. In other words, it is effective to create a physically non-facing state and perform simultaneous activation. The term "physically non-facing state" indicates that the substrates may be arranged in parallel in plan view or may be arranged so as to be opposed to each other with, for example, a shielding plate interposed therebetween.

Cross-sectional TEM observation of the interfacial states of the composite substrates according to Examples 1 to 4 revealed that no segregation of a metal or no presence of an intermediate layer was detected.

REFERENCE SIGNS LIST 1 composite substrate
10 supporting substrate
10a main surface
20 semiconductor portion
20a main surface
30 interfacial inclusion

The invention claimed is:

1. A composite substrate comprising:
   a supporting substrate comprising a single crystal of an insulating material;
   a silicon semiconductor portion on the supporting substrate; and
   interfacial inclusions present in a density of 10$^{12}$ atoms/cm$^2$ or less and located at an interface between the supporting substrate and the silicon semiconductor portion, the interfacial inclusions containing Ni and Fe, and the ratio of Ni to Fe being 0.4 or more.

2. The composite substrate according to claim 1, wherein the interfacial inclusions contain Ni and Fe, and the ratio of Ni to Fe is 1 or more.

3. The composite substrate according to claim 1, wherein the support substrate is formed of one selected from lithium tantalate, silicon carbide, and sapphire.

4. A method for producing a composite substrate, comprising:
   a preparation step of preparing a supporting substrate comprising a single crystal of an insulating material and a single-crystal silicon semiconductor substrate;
   an activation step of individually irradiating a main surface of the supporting substrate and a main surface of the silicon semiconductor substrate using a fast atom beam (FAB) gun to activate both of the main surfaces with the silicon the semiconductor substrate and the supporting substrate not facing each other to form an activated main surface of the silicon semiconductor substrate and an activated main surface of the supporting substrate;
   a metal supply step of supplying a metal containing Ni and Fe to at least one of the activated main surface of the supporting substrate and the activated main surface of the silicon semiconductor substrate, the metal being composed of a metal element other than main components contained in the supporting substrate and the silicon semiconductor substrate;
   a bonding step of bringing the activated main surface of the silicon semiconductor substrate and the activated main surface of the supporting substrate into contact with each other at normal temperature to bond the silicon semiconductor substrate and the supporting substrate together; and
   a thickness reduction step of reducing the thickness of the silicon semiconductor substrate from the other main surface of the silicon semiconductor substrate to form the silicon semiconductor substrate to a silicon semiconductor portion to form a composite substrate comprising a supporting substrate comprising a single crystal of an insulating material, a silicon semiconductor portion on the supporting substrate, and interfacial inclusions located at an interface between the supporting substrate and the silicon semiconductor portion in a density of 10$^{12}$ atoms/cm$^2$ or less, the interfacial inclusions containing Ni and Fe, and the ratio of Ni to Fe being 0.4 or more.

5. The method for producing a composite substrate according to claim 4, wherein the activation step and the metal supply step are simultaneously performed.

6. The method for producing a composite substrate according to claim 4, wherein the activation step includes:
   a first activation substep of activating the silicon semiconductor substrate using the FAB gun in a state in which the silicon semiconductor substrate does not face the supporting substrate, and
   a second activation substep of activating the supporting substrate by irradiation using the FAB gun under a condition ln which cumulative irradiation energy is lower than that of irradiation using the FAB gun ln the first activation substep.

7. The method for producing a composite substrate according to claim 6, further comprising, after the first activation substep and before the bonding step, an additional irradiation step of subjecting the silicon semiconductor substrate to irradiation using the FAB gun under a condition in which cumulative irradiation energy is lower than that of the irradiation using the FAB gun ln the first activation substep.

* * * * *